(12) United States Patent
Park et al.

(10) Patent No.: US 8,759,917 B2
(45) Date of Patent: Jun. 24, 2014

(54) THIN-FILM TRANSISTOR HAVING ETCH STOP MULTI-LAYER AND METHOD OF MANUFACTURING THE SAME

(75) Inventors: Joon Seok Park, Seongnam-si (KR); Tae Sang Kim, Seoul (KR); Yun-Hyuk Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 47 days.

(21) Appl. No.: 12/929,066

(22) Filed: Dec. 28, 2010

(65) Prior Publication Data
US 2011/0163310 A1 Jul. 7, 2011

(30) Foreign Application Priority Data

Jan. 4, 2010 (KR) .................. 10-2010-0000189
Oct. 19, 2010 (KR) .................. 10-2010-0101875

(51) Int. Cl.
*H01L 29/786* (2006.01)

(52) U.S. Cl.
USPC ........................................ 257/347

(58) Field of Classification Search
USPC ........................................ 257/347
See application file for complete search history.

(56) References Cited

U.S. PATENT DOCUMENTS

| | | | | |
|---|---|---|---|---|
| 5,903,014 A * | 5/1999 | Ino et al. | ............. | 257/66 |
| 6,019,796 A * | 2/2000 | Mei et al. | ............. | 438/151 |
| 6,734,116 B2 * | 5/2004 | Guo et al. | ............. | 438/792 |
| 7,026,713 B2 * | 4/2006 | Hoffman et al. | ............. | 257/749 |
| 7,132,687 B2 * | 11/2006 | Kawasaki et al. | ............. | 257/59 |
| 7,132,691 B1 | 11/2006 | Tanabe et al. | | |
| 7,626,201 B2 * | 12/2009 | Chiang et al. | ............. | 257/59 |
| 7,910,932 B2 * | 3/2011 | Marks et al. | ............. | 257/72 |
| 7,977,750 B2 * | 7/2011 | Kitakado et al. | ............. | 257/350 |
| 7,993,964 B2 * | 8/2011 | Hirao et al. | ............. | 438/104 |
| 8,093,589 B2 * | 1/2012 | Sugihara et al. | ............. | 257/43 |
| 8,129,718 B2 * | 3/2012 | Hayashi et al. | ............. | 257/43 |
| 8,188,472 B2 * | 5/2012 | Park et al. | ............. | 257/59 |
| 2005/0017244 A1 * | 1/2005 | Hoffman et al. | ............. | 257/72 |
| 2007/0090365 A1 * | 4/2007 | Hayashi et al. | ............. | 257/72 |
| 2007/0187760 A1 | 8/2007 | Furuta et al. | | |
| 2008/0108171 A1 | 5/2008 | Rogers et al. | | |
| 2008/0136990 A1 | 6/2008 | Kimura | | |
| 2008/0246064 A1 | 10/2008 | Kimura | | |
| 2008/0258143 A1 | 10/2008 | Kim et al. | | |
| 2008/0284710 A1 | 11/2008 | Kimura et al. | | |
| 2008/0284934 A1 | 11/2008 | Umezaki et al. | | |
| 2008/0299702 A1 * | 12/2008 | Son et al. | ............. | 438/104 |
| 2009/0001374 A1 | 1/2009 | Inoue et al. | | |
| 2009/0001387 A1 | 1/2009 | Kimura | | |
| 2009/0001469 A1 | 1/2009 | Yoshida et al. | | |

(Continued)

FOREIGN PATENT DOCUMENTS

EP    1843194 A1    10/2007
EP    1983499 A1    10/2008

(Continued)

*Primary Examiner* — Eugene Lee
(74) *Attorney, Agent, or Firm* — Harness, Dickey & Pierce, P.L.C.

(57) ABSTRACT

A thin-film transistor (TFT) may include a channel layer, an etch stop multi-layer, a source, a drain, a gate, and a gate insulation layer. The etch stop multi-layer may include a first etch stop layer and a second etch stop layer. The second etch stop layer may prevent or reduce an etchant from contacting the channel layer.

18 Claims, 9 Drawing Sheets

(56) References Cited

U.S. PATENT DOCUMENTS

| | | |
|---|---|---|
| 2009/0027372 A1 | 1/2009 | Shishido et al. |
| 2009/0040411 A1 | 2/2009 | Kawamura et al. |
| 2009/0117693 A1 | 5/2009 | Ohnuma |
| 2009/0141203 A1 | 6/2009 | Son et al. |
| 2009/0174023 A1 | 7/2009 | Takahashi et al. |
| 2009/0174835 A1 | 7/2009 | Lee et al. |
| 2009/0179200 A1 | 7/2009 | Saito et al. |
| 2009/0183766 A1 | 7/2009 | Takahashi et al. |
| 2009/0186445 A1 | 7/2009 | Akimoto |
| 2010/0065844 A1* | 3/2010 | Tokunaga .................. 257/43 |

FOREIGN PATENT DOCUMENTS

| | | |
|---|---|---|
| JP | 2002040227 A | 2/2002 |
| JP | 2007096160 A | 4/2007 |
| JP | 2008166716 A | 7/2008 |
| KR | 2007-0122517 A | 12/2007 |
| KR | 2008-0059163 A | 6/2008 |
| KR | 2008-0070811 A | 7/2008 |
| KR | 2008-0094300 A | 10/2008 |
| KR | 2008-0104588 A | 12/2008 |
| KR | 2008-0106148 A | 12/2008 |
| KR | 2009-0044119 A | 5/2009 |
| KR | 2009-0048650 A | 5/2009 |
| KR | 2009-0048651 A | 5/2009 |
| KR | 2009-0051125 A | 5/2009 |
| KR | 2009-0052901 A | 5/2009 |
| KR | 2009-0053862 A | 5/2009 |
| KR | 2009-0057689 A | 6/2009 |
| KR | 2009-0073031 A | 7/2009 |
| KR | 2009-0075554 A | 7/2009 |
| KR | 2009-0077706 A | 7/2009 |

* cited by examiner

THIN-FILM TRANSISTOR HAVING ETCH STOP MULTI-LAYER AND METHOD OF MANUFACTURING THE SAME

CROSS-REFERENCE TO RELATED APPLICATIONS

This application claims priority under U.S.C. §119 to Korean Patent Application No. 10-2010-0000189, filed on Jan. 4, 2010, and Korean Patent Application No. 10-2010-0101875, filed on Oct. 19, 2010, in the Korean Intellectual Property Office (KIPO), the entire contents of each of which are incorporated herein by reference.

BACKGROUND

1. Field

Example embodiments relate to thin-film transistors (TFTs) having an etch stop multi-layer and methods of manufacturing the TFTs.

2. Description of the Related Art

Thin-film transistors (TFTs) may be used in various application fields, and specifically, used as switching and driving devices in displays. Recently, liquid crystal displays (LCDs) have been used as panels for televisions (TVs), while organic light emitting displays (OLEDs) have been studied to be applied in TVs. Displays for TVs have been developed to satisfy requirements in the TV market. Such requirements may be relatively large TVs or digital information displays (DIDs), lower costs, and high-definition (moving image presentation, high-resolution, brightness, contrast ratio, or color reproductivity). In order to satisfy these requirements, a large substrate formed of glass along with a highly efficient TFT to be used as a switching and driving device of a display may be required.

TFTs having characteristics of both an amorphous silicon TFT and a polycrystalline silicon TFT are being actively studied. One of these TFTs may be an oxide semiconductor device, for example, a zinc oxide (ZnO)-based TFT. Examples of a ZnO-based material may include ZnO, indium-zinc oxide (IZO), a ZnO doped with gallium (Ga), magnesium (Mg), aluminum (Al), or iron (Fe), and an IZO doped with Ga, Mg, Al, or Fe. A ZnO-based semiconductor device may be manufactured at a relatively low temperature, may be in an amorphous state, and thus may be more easily manufactured to have a large size. Also, a ZnO-based semiconductor film has higher mobility, and thus has improved electrical characteristics like those of polycrystalline silicon. Studies to use an oxide semiconductor material layer having higher mobility, e.g., a ZnO-based material layer, for a channel region of a TFT are being actively performed.

SUMMARY

According to example embodiments, a thin-film transistor (TFT) may include a gate insulation layer on a gate, a channel layer on the gate insulation layer, the gate corresponding with the channel layer, an etch stop multi-layer on a portion of the channel layer and a source and a drain contacting ends of the channel layer.

The channel layer may include an oxide semiconductor. The etch stop multi-layer may include a first etch stop layer and a second etch stop layer sequentially stacked on the channel layer. The first etch stop layer may be formed at a temperature lower than a temperature at which the second etch stop layer is formed. The second etch stop layer may be formed at a temperature higher than a temperature at which the first etch stop layer is formed.

The second etch stop layer may be structurally denser than the first etch stop layer. The etch stop multi-layer may further include at least one third etch stop layer on the second etch stop layer. The at least one third etch stop layer may be structurally denser than the first etch stop layer.

The first and second etch stop layers may include at least one material selected from the group consisting of silicon oxide, silicon nitride, aluminum oxide, silicon oxynitride, fluorinated silicon oxide, and silicon oxycarbide. The TFT may further include a passivation layer on the etch stop multi-layer, the source, and the drain.

According to example embodiments, a method of manufacturing a thin film transistor (TFT) may include forming a gate on a substrate, forming a gate insulation layer on the substrate, the gate insulation layer covering the substrate and the gate, forming a channel layer on the gate insulation layer, the channel layer corresponding to the gate, forming an etch stop multi-layer on the channel layer, the etch stop multi-layer covering a portion of the channel layer, and forming a source and a drain on each end of the channel layer.

The channel layer may be formed of an oxide semiconductor. The oxide semiconductor may include at least one material selected from the group consisting of zinc oxide, gallium indium zinc oxide, and hafnium indium zinc oxide.

Forming the etch stop multi-layer may include forming a first etch stop layer on the channel layer, and forming a second etch stop layer on the first etch stop layer. The first etch stop layer may be formed at a temperature lower than a temperature at which the second etch stop layer is formed. The first etch stop layer may be formed via a plasma-enhanced chemical vapor deposition (PECVD) process at 150° C. and the second etch stop layer may be formed via a PECVD process at 350° C.

The method may further include forming at least one etch stop layer on the second etch stop layer. The etch stop multi-layer may be formed of at least one material selected from the group consisting of silicon oxide ($SiO_x$), silicon nitride ($SiN_x$), aluminum oxide ($Al_xO_x$), silicon oxynitride (SiON), fluorinated silicon oxide (SiOF), and silicon oxycarbide (SiOC). The method may further include forming a passivation layer on the etch stop multi-layer, the source, and the drain.

BRIEF DESCRIPTION OF THE DRAWINGS

Example embodiments will be more clearly understood from the following detailed description taken in conjunction with the accompanying drawings. FIGS. 1-4H represent non-limiting, example embodiments as described herein.

FIG. 1 is a cross-sectional view illustrating a structure of a thin-film transistor (TFT) according to example embodiments;

FIG. 3 is a graph illustrating results of a negative bias stress experiment performed on TFTs according to example embodiments and a comparative example;

FIG. 4 is a cross-sectional view illustrating a structure of a TFT according to example embodiments.

Figure 1:
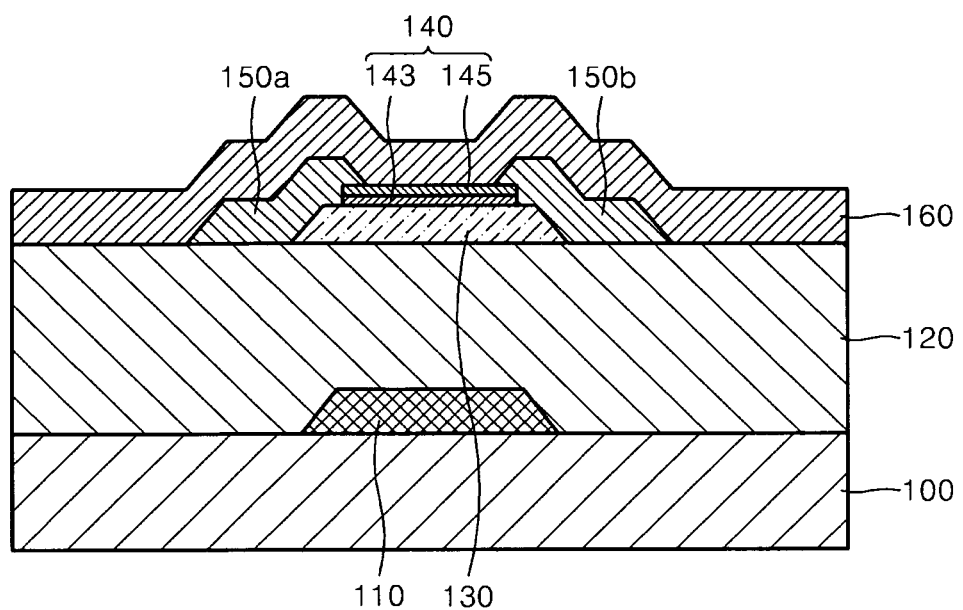
Figure 2A:
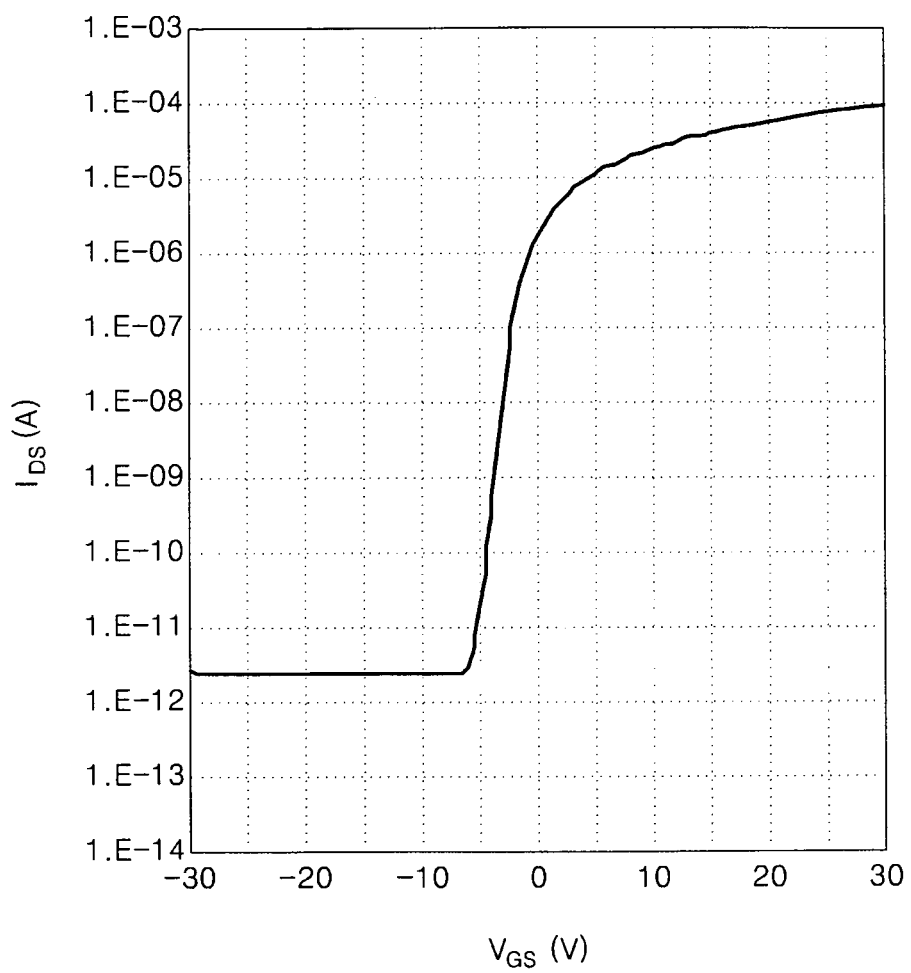
FIG. 2A is a graph illustrating the relationship between a gate voltage and a drain current of the TFT including an etch stop multi-layer illustrated in FIG. 1.
Figure 2B:
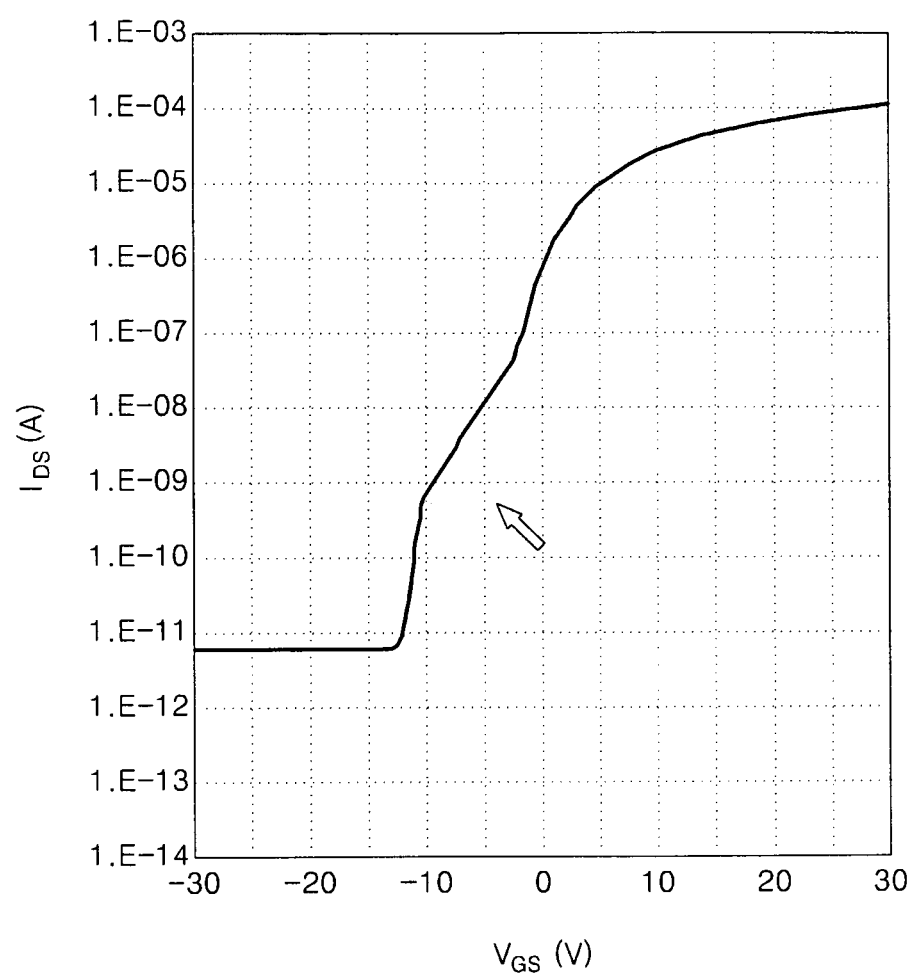
FIG. 2B is a graph illustrating the relationship between a gate voltage and a drain current of a TFT including a single etch stop layer, according to a comparative example.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Reference will now be made in detail to embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description. In the drawings, the sizes or thicknesses of elements are exaggerated for clarity, and like reference numerals denote like elements. It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. In the drawings, the thicknesses of layers and regions are exaggerated for clarity. Like reference numerals in the drawings denote like elements.

FIG. 1 is a cross-sectional view illustrating a structure of a thin-film transistor (TFT) according to example embodiments. In FIG. 1, the TFT is a bottom gate type. The bottom gate type TFT may be manufactured at lower expenses than a top gate type TFT, because the bottom gate type TFT involves less manufacturing operations.

Referring to FIG. 1, a gate 110 may be formed on a part of a substrate 100. When the substrate 100 is formed of silicon, an oxide layer (not shown) may be further formed on the substrate 100 through a thermal oxidation process. A gate insulation layer 120 may be formed on the substrate 100 and the gate 110. A channel layer 130 corresponding to the gate 110 may be formed partially on the gate insulation layer 120. An etch stop multi-layer 140 may be formed partially on the channel layer 130. The etch stop multi-layer 140 may include a first etch stop layer 143 and a second etch stop layer 145. A source 150a and a drain 150b may be respectively formed on ends of the channel layer 130 and the etch stop multi-layer 140. A passivation layer 160 for covering the etch stop multi-layer 140, the source 150a, and the drain 150b may be formed on the gate insulation layer 120.

The substrate 100 may be any substrate that is generally used in a semiconductor device, and may be formed of silicon, glass, or an organic material. A silicon oxide ($SiO_2$) layer (not shown) may be further formed on the substrate 100 through a thermal oxidation process.

The gate 110 may be formed of a conductive material, for example, a metal, e.g., titanium (Ti), platinum (Pt), ruthenium (Ru), gold (Au), silver (Ag), molybdenum (Mo), aluminum (Al), tungsten (W), or copper (Cu), or a metal, e.g., indium zinc oxide (IZO), indium tin oxide (ITO) or aluminum zinc oxide (AZO), or conductive oxide.

The gate insulation layer 120 may be formed of an insulation material generally used in a semiconductor device. Examples of the insulation material may include silicon dioxide ($SiO_2$), hafnium oxide ($HfO_2$), aluminum oxide ($Al_2O_3$), silicon nitride ($Si_3N_4$) and a mixture of $HfO_2$, $Al_2O_3$, and $Si_3N_4$, wherein the $HfO_2$, $Al_2O_3$, and $Si_3N_4$ may be high dielectric constant materials (high-k dielectric) having a higher dielectric constant than that of $SiO_2$.

The channel layer 130 may be formed of amorphous silicon, polycrystalline-silicon, or an oxide semiconductor. For example, the channel layer 130 may be formed of a zinc oxide-based oxide semiconductor, for example, zinc oxide, gallium indium zinc oxide, or hafnium indium zinc oxide. The channel layer 130 may be formed of, for example, ZnO, GaInZnO (GIZO) or HfInZnO (HIZO). A TFT formed of an oxide semiconductor has been recently drawing attention in flat panel display fields. The TFT formed of the oxide semiconductor may be suitable as a switching device of a transparent active matrix liquid crystal display (AMLCD) or active matrix organic light emitting diode (AMOLED) due to its optical transparency.

The etch stop multi-layer 140 may include the first etch stop layer 143 and the second etch stop layer 145. The etch stop multi-layer 140 may be formed of silicon oxide ($SiO_x$), silicon nitride ($SiN_x$), aluminum oxide ($Al_xO_x$), silicon oxynitride (SiON), fluorinated silicon oxide (SiOF), or silicon oxycarbide (SiOC), but is not limited thereto. in other words, the first and second etch stop layers 143 and 145 may be formed of $SiO_x$, $SiN_x$, aluminum oxide $Al_xO_x$, SiON, SiOF, or SiOC, but are not limited thereto. The second etch stop layer 145 may have a denser structure than the first etch stop layer 143. As an example method to achieve the aforementioned densities of the first and second etch stop layers 143 and 145, the second etch stop layer 145 may be formed at a higher temperature than the first etch stop layer 143.

For example, the first etch stop layer 143 may be formed at a temperature range between about 100° C. and about 250° C. and the second etch stop layer 145 may be formed at a temperature range between about 250° C. and about 400° C. In example embodiments, the thickness of each of the first etch stop layer 143 and the second etch stop layer 145 may be between about 20 nm and about 200 nm. For example, the thickness of each of the first etch stop layer 143 and the second etch stop layer 145 may be between about 50 nm and about 150 nm.

For example, a single etch stop layer formed on a channel layer through a low temperature plasma-enhanced chemical vapor deposition (PECVD) process may be porous, and thus, an etchant may penetrate through the single etch stop layer. In other words, in a TFT, including the single etch stop layer, an etchant used to etch a source and a drain may reach the channel layer through the single etch stop layer. Accordingly, the channel layer may be damaged by the etchant. However, when the single etch stop layer is formed on the channel layer through a high-temperature PECVD process in order to structurally densify the single etch stop layer so that the etchant does not penetrate through to the channel layer, the channel layer may lose device characteristics due to the higher temperature.

In the TFT of FIG. 1, the channel layer 130 may be prevented or reduced from losing device characteristics by partially forming the first etch stop layer 143 through a low-temperature PECVD process on the channel layer 130, for example, a temperature between about 100° C. and about 250° C. Also, by partially forming the second etch stop layer 145 that is structurally denser than the first etch stop layer 143 through a high-temperature PECVD process on the first etch stop layer 143, for example, a temperature between about 250° C. and about 400° C., the etchant may be prevented or reduced from reaching the channel layer 130. Accordingly, the channel layer 130 may be prevented or reduced from being damaged by the etchant.

Also, the TFT including the first and second etch stop layer 143 and 145 may have an improved subthreshold swing, an improved threshold voltage, an improved field effect mobility, and higher stability. For example, when the first and second etch stop layers 143 and 145 are formed by using $SiO_2$, the first etch stop layer 143 may be formed by using a PECVD process at a temperature range between about 100° C. and about 250° C., for example at about 150° C., and the second etch stop layer 145 may be formed by using a PECVD process at a temperature range between about 250° C. and about 400° C., for example at about 350° C.

The source and drain 150a and 150b may each be formed of a conductive material. For example, the source and drain 150a and 150b may each be formed of a metal, e.g., Ti, Pt, Ru, Au, Ag, Mo, Al, W, or Cu, or a metal or conductive oxide, e.g., IZO or AZO.

The passivation layer 160 may be formed of a silicon oxide, a silicon nitride, or an organic matter. Also, the passivation layer 160 may have a structure in which at least two layers each formed of a silicon oxide, a silicon nitride, or an organic matter are stacked on each other.

A comparison experiment performed on the TFT including the first and second etch stop layers 143 and 145 according to example embodiments and the TFT including the single etch stop layer according to the comparative example will now be described. The TFT according to example embodiments is manufactured as follows. The gate 110 formed of ITO and having a thickness of about 200 nm is deposited on the substrate 100 formed of glass and having a size of about 150 mm×150 mm via electron beam evaporation, and $SiO_x$ having a thickness of about 400 nm is grown as the gate insulation layer 120 by using a PECVD method.

Also, the channel layer 130 formed of HIZO and having a thickness of about 20 nm is formed by using a radio-frequency sputtering method. The first etch stop layer 143 is formed by depositing SiOx having a thickness of about 100 nm at a substrate temperature of about 150° C. by using a PECVD method. The second etch stop layer 145 is formed by growing SiOx having a thickness of about 100 nm at a substrate temperature of about 350° C. by using a PECVD method. As a result, the etch stop multi-layer 140 has a thickness of about 200 nm.

The source and drain 150a and 150b are formed by sputtering IZO having a thickness of about 200 nm, and patterning the sputtered IZO via photolithography by using a mixture of nitric acid and acetic acid. All other patterning processes are performed by suitably using photolithography and wet or dry etching. The TFT is annealed in the air at about 250° C. for about 1 hour.

The TFT according to the comparative example includes the single etch stop layer instead of the first and second etch stop layers 143 and 145, wherein the single etch stop layer is formed by depositing SiOx having a thickness of 200 nm at a substrate temperature of 150° C. by using a PECVD method.

Characteristics of the TFTs according to example embodiments and the comparative example, wherein widths and lengths of channel layers are respectively about 70 μm and about 20 μm were measured by using a Keithley 4200-SCS semiconductor characteristic analyzer under a vacuum state. A halogen lamp was used to provide a visible ray of 200 lux during a negative bias stress experiment, a gate voltage of −20 V and a drain voltage of 10 V were applied, and transfer curves were collected every 30 minutes during a stress time of total 12 hours. The transfer curves were obtained in each of the TFTs according to example embodiments and the comparative example, and initial characteristic values of the TFTs are shown in Table 1 below.

TABLE 1

| TFT | $\mu_{FE}$ (cm²/Vs) | $V_T$(V) | S(V/decade) | $N_{tot}$(cm⁻²) |
|---|---|---|---|---|
| Example Embodiments | 7.04 | 0.17 | 0.17 | $1.36 \times 10^{12}$ |
| Comparative Example | 6.03 | −1.08 | 0.61 | $4.69 \times 10^{12}$ |

Referring to Table 1, the TFT according to example embodiments has higher field effect mobility $\mu_{FE}$, higher subthreshold swing S, and operates more closely in an enhancement mode compared to the TFT according to the comparative example.

A value of the subthreshold swing S is related to a defect number $N_{bulk}$ of a semiconductor bulk forming a channel layer and a defect number $N_{it}$ of an interface between a semiconductor and a gate insulation layer as shown in Equation 1 below.

$$N_{tot} = N_{bulk} + N_{it} = \left(\frac{\log_e S}{kT/q} - 1\right)\frac{C_{ox}}{q} \quad \text{Equation 1}$$

Here, $N_{tot}$ denotes a total of the defect numbers $N_{bulk}$ and $N_{it}$, k denotes a Boltzmann constant, T denotes a temperature, q denotes a charge amount, and $C_{ox}$ denotes capacitance of an oxide gate. Referring to the initial characteristic values shown in Table 1, defect numbers on a HIZO bulk and an interface between a semiconductor and a gate insulation layer of the TFT according to example embodiments are lower than defect numbers on a HIZO bulk and an interface between a semiconductor and a gate insulation layer of the TFT according to the comparative example. Accordingly, the TFT according to example embodiments has improved field effect mobility, threshold voltage, and subthreshold swing compared to the TFT according to the comparative example.

Figure 3:
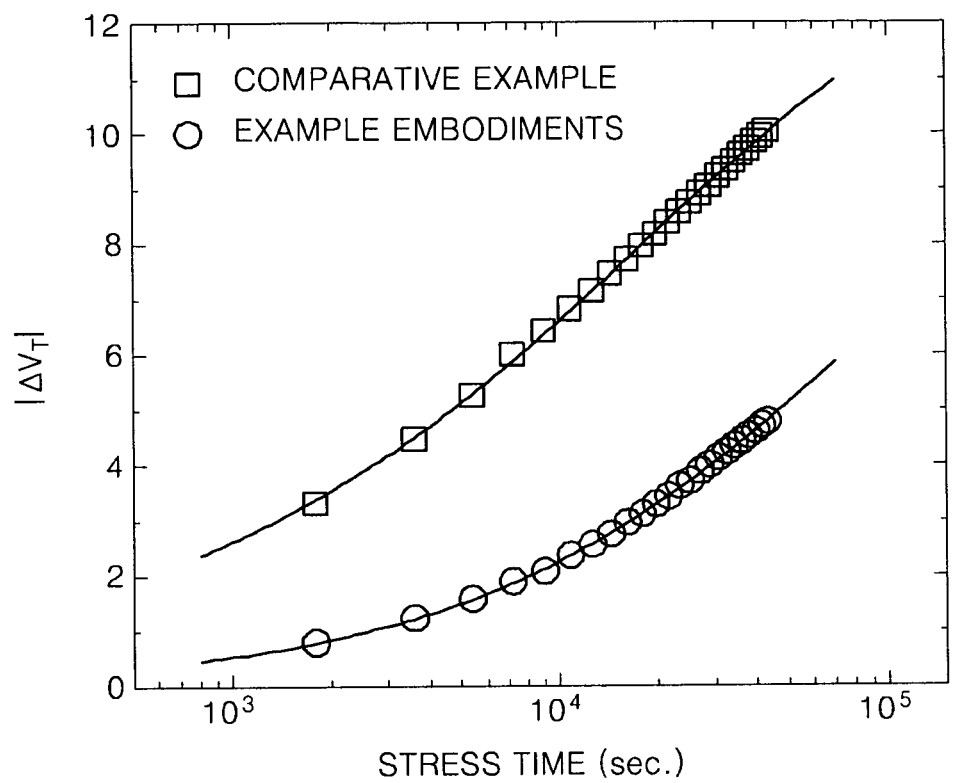

FIG. 3 is a graph illustrating results of the negative bias stress experiment performed on the TFTs according to example embodiments and the comparative example. The results of the negative bias stress experiment satisfy Equation 2 below, wherein degradation of a TFT according to charge trapping on an interface between a semiconductor and a gate insulation layer is reflected.

$$|\Delta V_T| = |\Delta V_{T0}|\left(1 - \exp\left\{-\left(\frac{t}{\tau}\right)^\beta\right\}\right) \quad \text{Equation 2}$$

Here, $\Delta V_{To}$ denotes a change amount of a threshold voltage $V_T$ for infinite time, β denotes a stretched-exponential exponent, and $\tau$ denotes a characteristic trapping time of a carrier. Each value is shown in Table 2 below.

TABLE 2

| TFT | $|\Delta V_{To}|$ (V) | T(S) | β |
|---|---|---|---|
| Example Embodiments | 9.04 | $5 \times 10^4$ | 0.67 |
| Comparative Example | 12.9 | $2 \times 10^4$ | 0.50 |

Referring to FIG. 3, a size of a threshold voltage change amount $\Delta V_T$ of the TFT according to example embodiments is smaller than a size of a threshold voltage change amount of the TFT according to the comparative example during the same stress time. Such a result shows that the TFT according to example embodiments is more stable with respect to negative bias stress. Also, the result shows that more hole trappings are generated on the interface between the semiconductor and the gate insulation layer of the TFT according to the comparative example.

Figure 4:
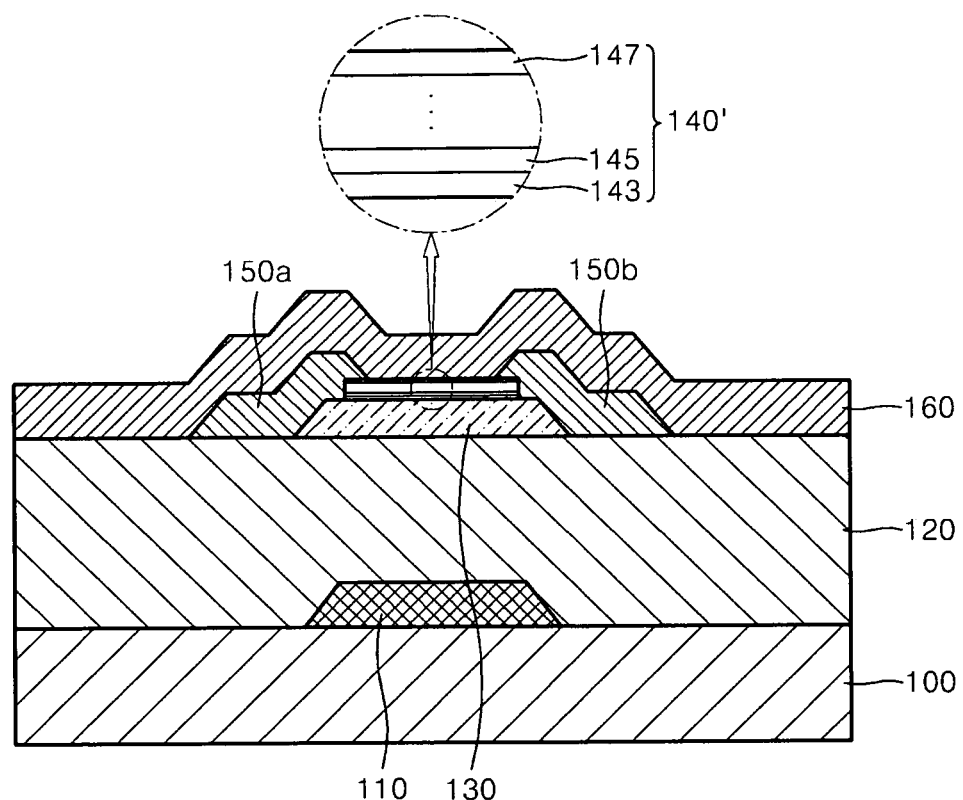

FIG. 4 is a cross-sectional view illustrating a structure of a TFT according to example embodiments. An etch stop multi-layer 140' of FIG. 4 may further include at least one third etch stop layer 147 besides the first and second etch stop layers 143 and 145 of the etch stop multi-layer 140 of FIG. 1.

For example, the etch stop multi-layer 140' may include at least one third etch stop layer 147 on the second etch stop layer 145. The at least one third etch stop layer 147 may be formed of silicon oxide, silicon nitride, aluminum oxide, SiON, SiOF, or SiOC, but is not limited thereto. The at least one third etch stop layer 147 may be formed at a temperature higher than the first or second etch stop layer 143 or 145, and thus may be structurally denser than the first or second etch stop layer 143 or 145.

However, when the at least one third etch stop layer 147 is formed at a temperature lower than the first or second etch stop layer 143 or 145, the at least one third etch stop layer 147 may not be structurally denser than the first or second etch stop layer 143 or 145. In example embodiments, the thickness of each of the first and second etch stop layers 143 and 145 and at least one third etch stop layer 147 may be between about 20 nm and about 200 nm. For example, the thickness of each of the first and second etch stop layers 143 and 145 and at least one third etch stop layer 147 may be between about 50 nm and about 150 nm.

FIGS. 5A through 5H are diagrams for describing a method of manufacturing the TFT of FIG. 1, according to example embodiments. The TFT may be a bottom gate type. Like reference numerals in FIGS. 1 and 5A through 5H denote like elements.

Figure 5A:
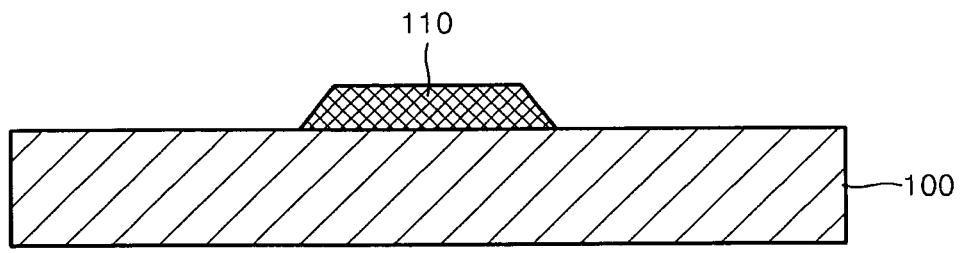
FIGS. 5A through 5H are diagrams for describing a method of manufacturing the TFT of FIG. 1, according to example embodiments.

Referring to FIG. 5A, the substrate 100 may be prepared. The substrate 100 may be formed of silicon, glass, or an organic matter. When the substrate 100 is formed of silicon, an insulation layer, e.g., a $SiO_2$ layer, may be formed on the surface of the substrate 100 through a thermal oxidation process. The gate 110 may be partially formed on the substrate 100 by coating a conductive material, e.g., a metal or a conductive metal oxide, on the substrate 100 and patterning the conductive material.

Figure 5B:
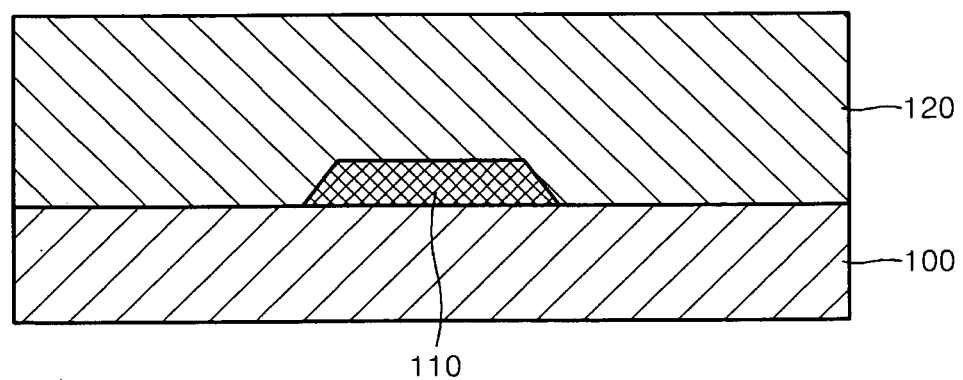

Referring to FIG. 5B, the gate insulation layer 120 may be formed by coating an insulation material on the substrate 100 and the gate 110. The gate insulation layer 120 may be formed of $SiO_2$ or one of $HfO_2$, $Al_2O_3$, and $Si_3N_4$ and a mixture thereof, wherein the $HfO_2$, $Al_2O_3$, and $Si_3N_4$ may be high dielectric constant materials (high-k dielectric) having a higher dielectric constant than that of $SiO_2$.

Figure 5C:
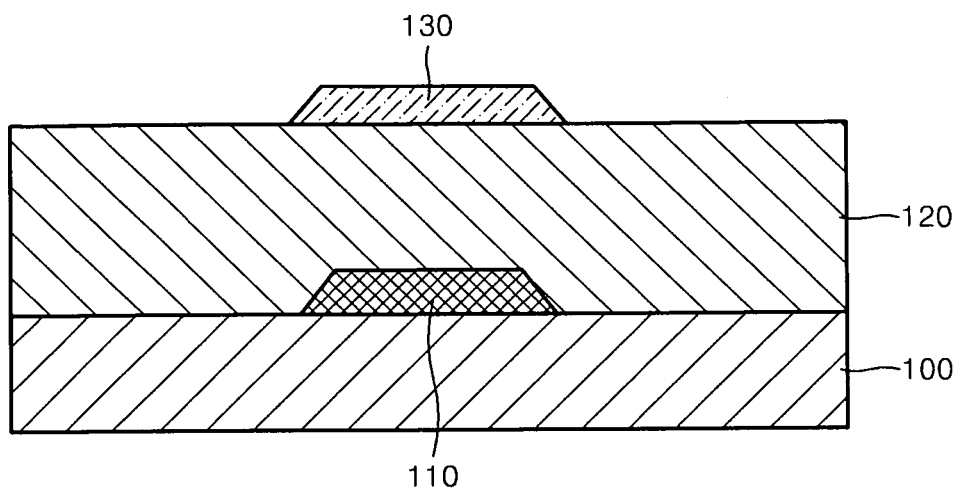

Referring to FIG. 5C, the channel layer 130 may be partially formed on the gate insulation layer 120. The channel layer 130 may be formed by using a physical vapor deposition (PVD) method, e.g., a sputtering or evaporation method, but any other methods may be used. The channel layer 130 may be formed of an oxide semiconductor, e.g., a ZnO-based oxide semiconductor.

Figure 5D:
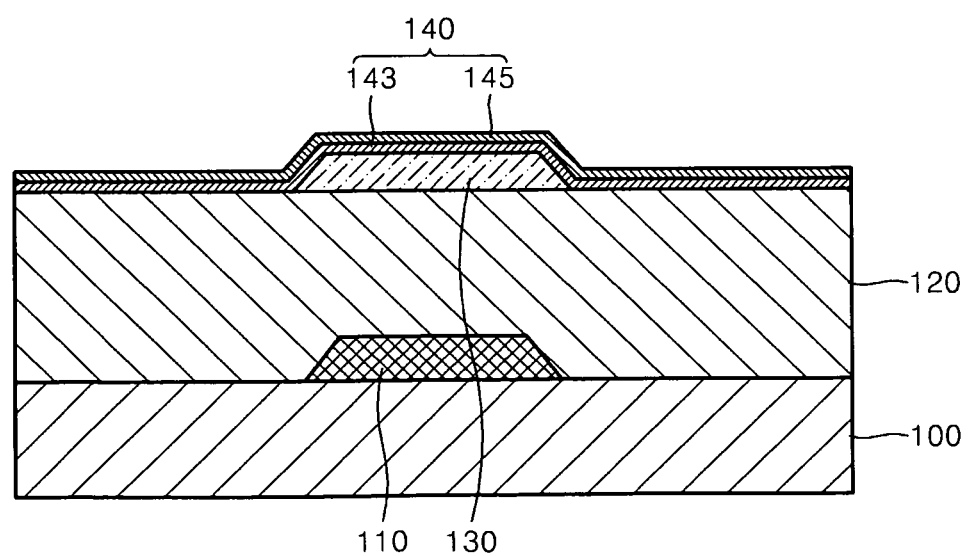
Figure 5E:
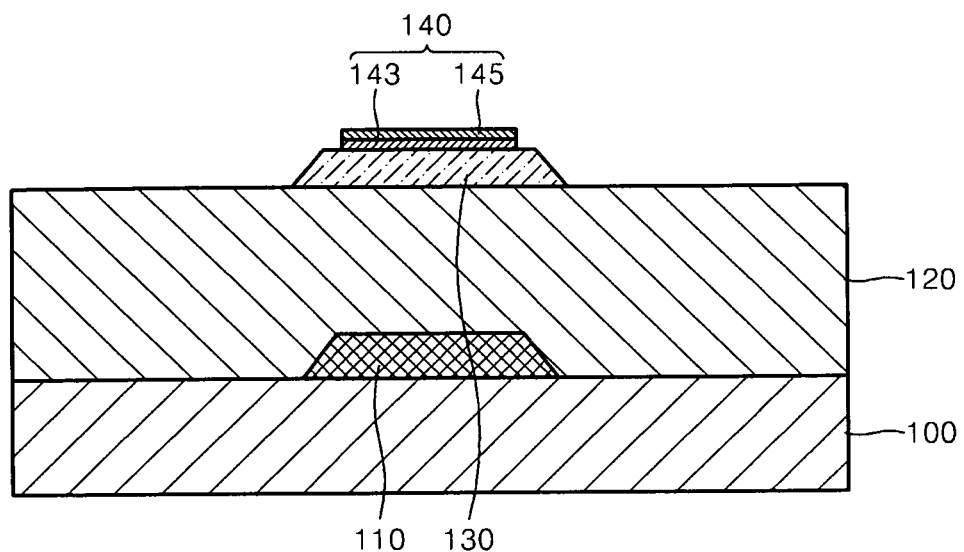

Referring to FIGS. 5D and 5E, the first etch stop layer 143 may be formed on the channel layer 130 and the gate insulation layer 120 through a low-temperature PECVD process, for example, deposition of $SiO_2$ at a temperature range between about 100° C. and about 250° C., for example, at about 150° C., of a substrate temperature. The second etch stop layer 145 may be formed on the first etch stop layer 143 through a high-temperature PECVD process, for example, deposition of $SiO_2$ at a temperature range between about 250° C. and about 400° C., for example, at about 350° C., of a substrate temperature. The first and second etch stop layers 143 and 145 may each be formed of silicon oxide, silicon nitride, aluminum oxide, SiON, SiOF, or SiOC. The first and second etch stop layers 143 and 145 may be formed on the channel layer 130 by depositing the above material on the channel layer 130 and the gate insulation layer 120, and patterning the material as illustrated in FIG. 5E. Although not illustrated in FIG. 5E, at least one third etch stop layer may be further formed on the second etch stop layer 145.

Figure 5F:
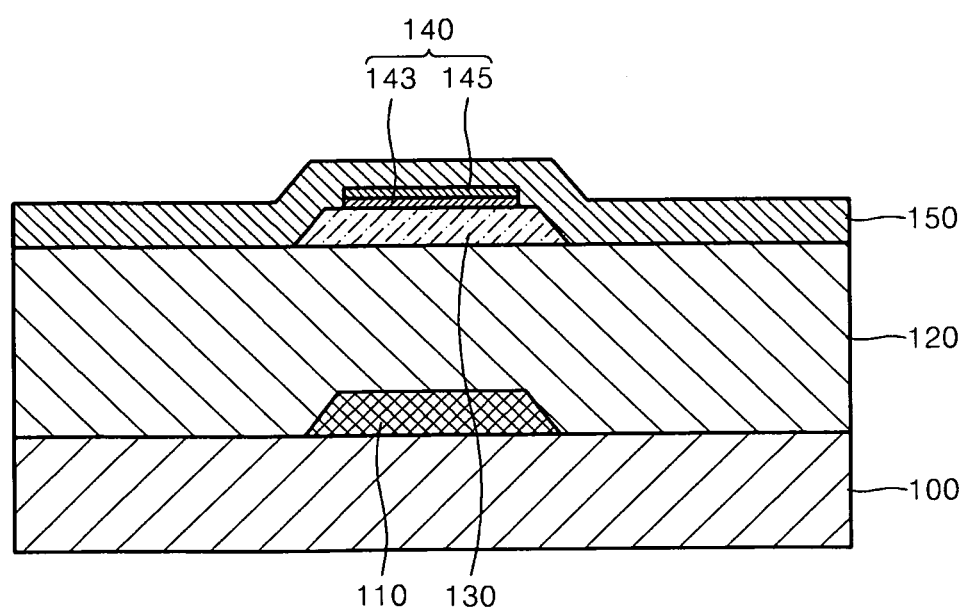
Figure 5G:
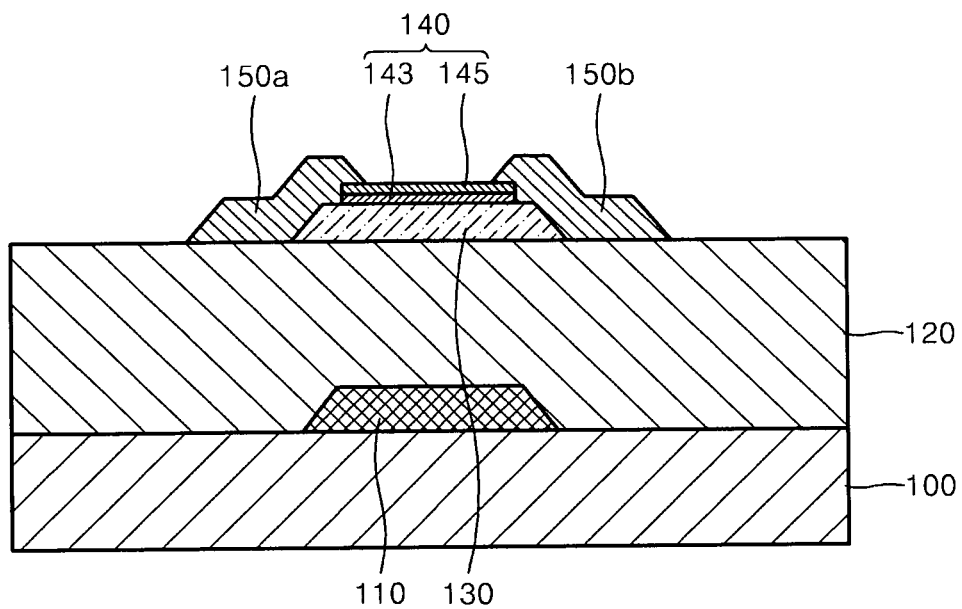

Referring to FIGS. 5F and 5G, a conductive material 150 may be deposited on the channel layer 130 and the etch stop multi-layer 140, and the conductive material may be patterned to expose the etch stop multi-layer 140 and form the source and drain 150a and 150b as illustrated in FIG. 5G.

Figure 5H:
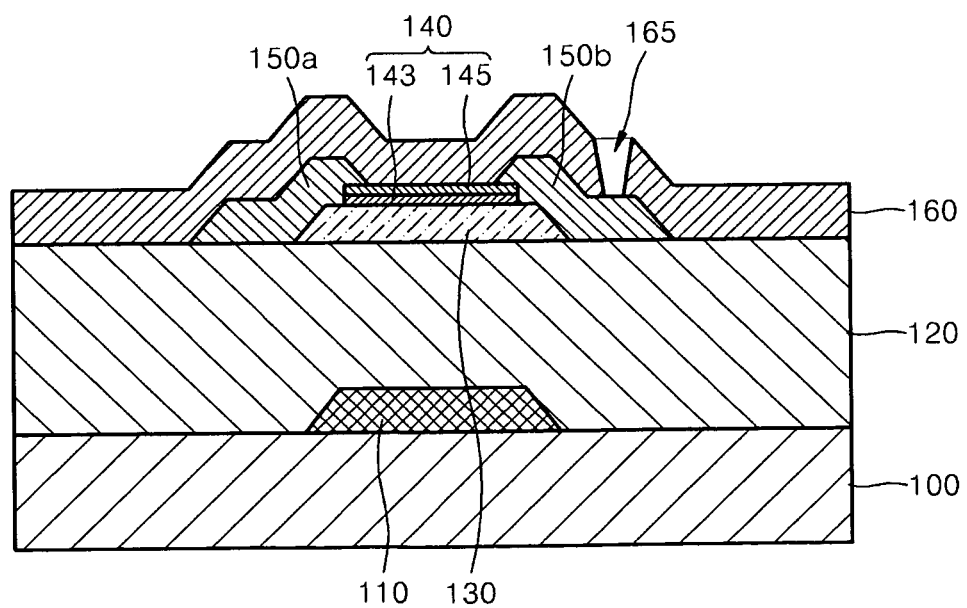

Referring to FIG. 5H, the passivation layer 160 may be formed to cover the etch stop multi-layer 140, the source 150a, and the drain 150b. The passivation layer 160 may have a single or multi-layered structure including at least one of a silicon oxide layer, a silicon nitride layer, and an organic layer. A via hole 165 may be formed through the passivation layer 160. Additionally, the TFT according to example embodiments may be annealed for about 1 hour in the air at about 250° C.

As described above, according to example embodiments, an etchant may be prevented from reaching a channel layer by penetrating through a single etch stop layer. Accordingly, the channel layer may be prevented from being damaged by the etchant, and a TFT having an improved subthreshold swing, an improved threshold voltage, an improved field effect mobility, and higher stability may be obtained.

The method may be performed by using a chemical deposition (CVD) process, a PVD process, or an atomic layer deposition (ALD) process.

It would be obvious to one of ordinary skill in the art that various semiconductor devices, for example, a driving transistor for a flat panel display, e.g., a liquid crystal display (LCD) or an organic light emitting display (OLED), and a transistor for a peripheral circuit of a memory device, may be manufactured by using an oxide semiconductor device as described in example embodiments.

It should be understood that example embodiments described therein should be considered in a descriptive sense only and not for purposes of limitation. Descriptions of features or aspects within each embodiment should typically be considered as available for other similar features or aspects in other example embodiments.

What is claimed is:

1. A thin-film transistor (TFT) comprising:
   a gate insulation layer on a gate;
   a channel layer on the gate insulation layer, the gate corresponding with the channel layer;
   first and second etch stop layers sequentially stacked on a portion of the channel layer, the first and second etch stop layers being formed of a same material, and the second etch stop layer being structurally denser than the first etch stop layer;
   a source and a drain contacting ends of the channel layer; and
   a passivation layer on the at least two etch stop layers, the source and the drain.

2. The TFT of claim 1, wherein the channel layer includes an oxide semiconductor.

3. The TFT of claim 2, wherein the oxide semiconductor comprises at least one material selected from the group consisting of zinc oxide, gallium indium zinc oxide, and hafnium indium zinc oxide.

4. The TFT of claim 1, wherein the second etch stop layer is formed at a temperature higher than a temperature at which the first etch stop layer is formed.

5. The TFT of claim 1, wherein the at least two etch stop layers further comprise at least one third etch stop layer on at least one of the first etch stop layer and the second etch stop layer.

6. The TFT of claim 5, wherein the third etch stop layer is structurally denser than the first etch stop layer.

7. The TFT of claim 1, wherein the first and second etch stop layers include at least one material selected from the group consisting of silicon oxide ($SiO_x$), silicon nitride ($SiN_x$), aluminum oxide ($Al_xO_x$), silicon oxynitride (SiON), fluorinated silicon oxide (SiOF), and silicon oxycarbide (SiOC).

8. A method of manufacturing a thin film transistor (TFT), the method comprising:
   forming a gate insulation layer on a gate;
   forming a channel layer on the gate insulation layer, the channel layer corresponding to the gate;
   forming first and second etch stop layers sequentially stacked on the channel layer, the first and second etch stop layers covering a portion of the channel layer and being formed of a same material, the second etch stop layer being structurally denser than the first etch stop layer;
   forming a source and a drain on each end of the channel layer; and
   forming a passivation layer on the at least two etch stop layers, the source, and the drain.

9. The method of claim 8, wherein the channel layer is formed of an oxide semiconductor.

10. The method of claim 9, wherein the oxide semiconductor comprises at least one material selected from the group consisting of zinc oxide, gallium indium zinc oxide, and hafnium indium zinc oxide.

11. The method of claim 8, wherein the first etch stop layer is formed at a temperature lower than a temperature at which the second etch stop layer is formed.

12. The method of claim 8, wherein the first etch stop layer is formed at a first temperature range between about 100° C. and about 250° C. and the second etch stop layer is formed at a second temperature range between about 250° C. and about 400° C.

13. The method of claim 8, further comprising:
forming at least one etch stop layer on the second etch stop layer.

14. The method of claim 8, wherein the first and second etch stop layers are formed of at least one material selected from the group consisting of silicon oxide ($SiO_x$), silicon nitride ($SiN_x$), aluminum oxide ($Al_xO_x$), silicon oxynitride (SiON), fluorinated silicon oxide (SiOF), and silicon oxycarbide (SiOC).

15. The TFT of claim 1, wherein each of the first and second etch stop layers has a thickness between about 20 nm and about 200 nm.

16. The TFT of claim 1, wherein the passivation layer is conformally formed along at least a top surface of the first and second etch stop layers, the source and the drain.

17. The TFT of claim 1, wherein the source and the drain contact a top surface and a side surface of the channel layer.

18. The TFT of claim 1, wherein the source and the drain contact the first and second etch stop layers.

* * * * *